United States Patent

Maass et al.

[11] Patent Number: 5,922,182
[45] Date of Patent: Jul. 13, 1999

[54] APPARATUS FOR COATING SUBSTRATES ESPECIALLY WITH MAGNETIZABLE MATERIALS

[75] Inventors: Wolfram Maass, Linsengericht; Peter Mahler, Hainberg; Michael Scherer, Rodenbach, all of Germany

[73] Assignee: Balzers Prozeb-Systeme GmbH, Germany

[21] Appl. No.: 08/960,386

[22] Filed: Oct. 29, 1997

[30] Foreign Application Priority Data

Oct. 30, 1996 [DE] Germany .................. 196 43 841

[51] Int. Cl.[6] .................................................. C23C 14/34
[52] U.S. Cl. ...................... 204/298.15; 204/298.28; 204/298.16; 204/298.11; 204/298.06; 204/192.12
[58] Field of Search ............... 204/298.28, 298.15, 204/298.16, 298.11, 298.06, 192.12

[56] References Cited

U.S. PATENT DOCUMENTS

| 4,581,118 | 4/1986 | Class et al. | 204/298 |
|---|---|---|---|
| 4,865,709 | 9/1989 | Nakagawa et al. | 204/192.12 |
| 5,334,298 | 8/1994 | Gegenwart | 204/192.12 |
| 5,423,971 | 6/1995 | Arnold et al. | 204/298.11 |
| 5,538,610 | 7/1996 | Gesche et al. | 204/298.15 |
| 5,630,916 | 5/1997 | Gerrish et al. | 204/192.12 |
| 5,795,448 | 8/1998 | Hurwitt et al. | 204/192.1 |
| 5,804,041 | 9/1998 | Hurwitt | 204/192.2 |

FOREIGN PATENT DOCUMENTS 0435838  12/1990  European Pat. Off. .

OTHER PUBLICATIONS

Patent Abstracts of Japan C–846, Jul. 2, 1991, vol. 15, No. 259.

*Primary Examiner*—Nam Nguyen
*Assistant Examiner*—Julian A. Mercado
*Attorney, Agent, or Firm*—Fulbright & Jaworski, LLP

[57] ABSTRACT

In an apparatus for coating substrates (9), especially with magnetizable materials such as NiFe, with a circular, disk-shaped, rotatably supported substrate holder (3), which is subjected to an HF bias voltage, which is provided around its circumference and on the back with dark-space shield (1), and which rotates under at least one opposing cathode (7), and with a device for generating a magnetic field (13) parallel to the plane of the substrate (9), the magnetic field is generated by an electromagnet, the exciter coil of which, together with the lower part of the yoke (10), is housed in the dark-space shield (1), whereas the extended pole pieces (12, 12'), which are electrically insulated from the coil yoke (10) via the dark space gap (2), are housed in the substrate holder (3) in proximity to the substrate (9).

9 Claims, 1 Drawing Sheet

APPARATUS FOR COATING SUBSTRATES ESPECIALLY WITH MAGNETIZABLE MATERIALS

FIELD OF THE INVENTION

The invention pertains to an apparatus for coating substrates 9, especially with magnetic materials such as NiFe, consisting of a circular disk-shaped, rotatably supported substrate holder 3 for holding at least one substrate 9, which holder can be connected to an HF bias voltage and which is provided with concentric dark-space screening 1 on the side facing away from the substrate and along the circumference; a device for generating an external field 13 parallel to the plane of the substrate; and at least one cathode 7, under which the substrate holder rotates during the coating process.

Apparatuses of this type are used for the production of, for example, so-called read-write heads for magnetic disk storage devices (see, for example, B. H. H. Gatzen, "Read-write heads for magnetic disk storage devices in conventional and thin-film technology", Feinwerkgerätebau und Messtechnik, Vol. 88, No. 2, pp. 53–104, March 1980).

DESCRIPTION OF THE PRIOR ART

It is known that NiFe layers for heads can be made in accordance with thin-film technology by magnetron sputtering, in which case the substrates are arranged in a weak external magnetic field parallel to the surface of the substrate for the purpose of adjusting the anisotropy (M. Hanazono et al., "Fabrication of a thin-film head, using polyimide resin and sputtered NiFe films", J. Appl. Phys., Vol. 53, No. 3, pp. 2,608–2,610, March 1982).

The influence of an RF bias voltage on the magnetic properties of sputtered layers with the magnetization direction in the plane of the layer is also known (Miaogen Lu et al., "Effects of RF bias on the texture, magnetics, and recording properties of RF sputtered CoCr/Cr longitudinal thin-film media, Transactions on Magnetics, Vol. 26, No. 5, pp. 1,581–1,583, September 1990).

Finally, it is known from DE 43 12 444 that a permanent magnet can be used to generate the desired anisotropy, where the field strength of the magnet and its direction with respect to the substrate are adjustable.

During the fabrication process, several substrates, usually ceramic disks, are arranged in a circle on a rotating table and passed under the cathode during the course of the dynamic coating operation. In an arrangement such as this, the external magnetic field required to produce the anisotropy must also be moved around with the substrate to maintain the preferred direction of anisotropy for the substrate as it undergoes rotation.

Of course, a static coating operation is also conceivable, in which one substrate after the other is moved in under the cathode. Although this arrangement makes it possible to use a static magnetic field, it also suffers, when used in conjunction with a sputter diode, from the disadvantage that the diode discharge is distorted by the external magnetic field and that therefore the layers are deposited in an irregular manner.

In the case of a magnetron cathode, conversely, the effect of the magnetron's magnetic field on the external field in the plane of the substrate must be kept as small as possible. Normally, this can only be accomplished by keeping the magnetron as far away as possible from the substrate, because the magnetron field is about 10 times stronger than the external field.

Finally, the substrates are preferably exposed to an HF bias voltage during the coating process in the external field, so that the magnetic coating properties can be influenced in the desired manner. In the case of a dynamic coating process, the task of the present invention is now to provide a way to generate the external field so that the magnetic field strength on the substrate, which is mounted on a rotating substrate holder and connected to an HF bias voltage, can be adjusted in a continuously variable manner.

SUMMARY OF THE INVENTION

This task is accomplished in accordance with the invention in that the rotating table is provided with dark-space screening and with an electromagnet for generating the variable external field, the pole pieces of this magnet in proximity to the substrate being connected to the HF bias voltage, whereas the yoke is housed together with the coil in the grounded dark-space screening.

As a result of this division of the magnetic yoke into two parts electrically insulated from each other, the advantage is obtained that the exciter coil and its lead are shielded in the grounded dark-space screening of the substrate holder against interference from the HF field.

The invention can be embodied in a wide variety of ways. An example is described in more detail in the attached schematic diagram.

DETAILED DESCRIPTION OF THE PREFERRED EMBODIMENTS

Figure 1:
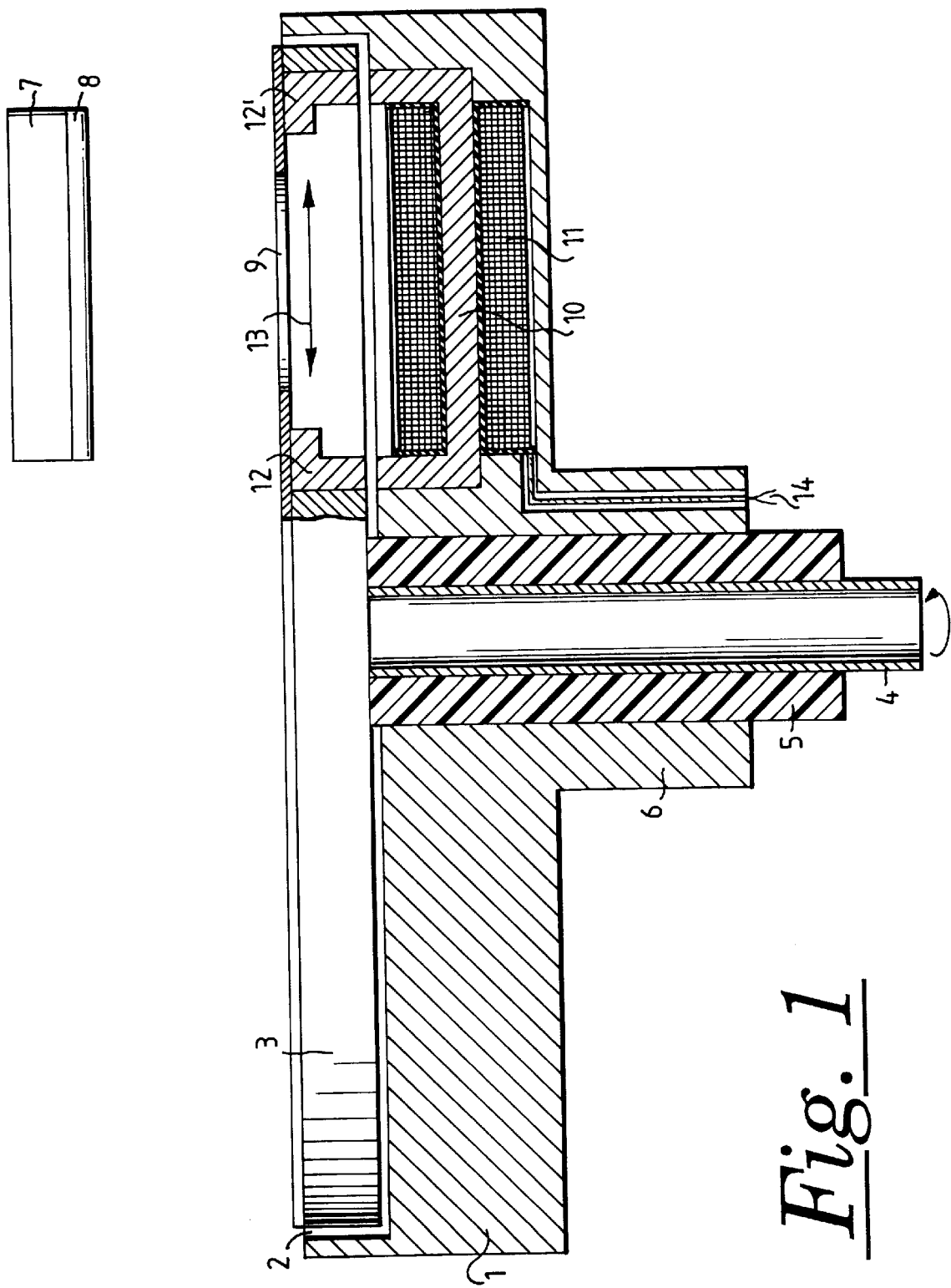
FIG. 1 hereto is a schematic sectional view of a preferred example of the invention taken through the center of the apparatus.

Referring to FIG. 1, the rotating table is assembled from several parts and consists essentially of a substrate holder 3 and dark-space shield 1. The shield is held and driven by a grounded, hollow shaft 6. The high-frequency connection (4) to substrate holder 3 is produced centrally by the hollow shaft 6, insulated by insulator 5. The substrate holder 3 is recessed in such a way into the rotating table that the rotating table surrounds the substrate holder 3, in the form of a dark-space shield 1 on the back and around the circumference thereof. Dark-space gap 2 will depend on the potential and pressure conditions. The width of the gap 2 is on the order of 1–2 mm.

Substrate 9, recessed into substrate holder 3, is rotated under dynamic operating conditions under cathode 7 and thus coated with target material 8. To produce an external magnetic field 13 parallel to the plane of the substrate 9, an electromnagnet 10 with a coil 11 is installed in dark- space shield 1. The magnetic flux generated by coil 11 with its lead 14 is conducted by yoke 10 to pole pieces 12, 12', which, separated by the dark-space gap 2, pass the flux onward in such a way that the external magnetic field is essentially parallel to the plane of the substrate 9.

LIST OF REFERENCE NUMBERS 1 dark-space shield
2 dark-space gap
3 substrate holder
4 HF feed
5 insulator
6 hollow shaft
7 cathode 8 target
9 substrate
10 yoke
11 coil
12, 12' pole pieces
13 external magnetic field
14 coil lead

What is claimed is:

1. Apparatus for coating substrates comprising a circular, disk-shaped, rotatably supported substrate holder for holding at least one substrate having a plane, wherein said holder is connected to an HF bias voltage and which is provided with concentric grounded dark-space shield on a side facing away from the substrate and along its circumference; a device for generating an external magnetic field parallel to the plane of the substrate; and at least one cathode having a sputtering target material, under which the substrate holder rotates during the coating operation, wherein the external magnetic field is generated by an electromagnet with a yoke having a lower part, said electromagnet having pole pieces which extend parallel to the substrate, where said lower part of the yoke and its exciter coil are housed in the grounded dark-space shield, whereas the extended pole pieces are housed in an electrically separated manner in the substrate holder in proximity to the substrate.

2. An apparatus for coating substrates, said apparatus comprising:

a generally disk-shaped substrate holder rotatably supported in said apparatus, said substrate holder being configured to hold at least one substrate and having a generally circular circumference and a side facing away from said substrate, said substrate having a plane;

an HF bias voltage connected to said substrate holder; and at least one cathode having a sputtering target material under which the substrate holder rotates during the coating operation;

a grounded dark-space shield facing a side of said substrate holder facing away from the substrate and having a concentric portion surrounding the circumference of said substrate holder;

a device for generating an external parallel to the plane of the substrate, the external magnetic field being generated by an electromagnet having an exciter coil and a yoke, said yoke having a lower portion operatively associated with the exciter coil;

the lower portion of the yoke and the exciter coil being housed in the dark-space shield;

first and second pole portions supported on said substrate holder in proximity to the substrate and electrically separated from said yoke, said pole portions receiving magnetic flux from the yoke extending from said lower portion of the yoke and creating a magnetic field therefrom which is generally parallel to said substrate.

3. The apparatus according to claim 2, and said pole portions and said yoke being spaced from each other and separated from each other by a gap.

4. The apparatus according to claim 3, and said substrate holder and said dark-space shield being spaced apart and separated from each other by said gap.

5. The apparatus according to claim 2, and said yoke having first and second portions extending toward said substrate from said lower portion.

6. The apparatus according to claim 5, wherein said pole portions align with said first and second yoke portions.

7. The apparatus according to claim 2, and said pole portions extending toward each other adjacent the substrate to form said external magnetic field therebetween.

8. The apparatus according to claim 2, and said cathode causing deposition of a magnetic material on the substrate.

9. The apparatus according to claim 8 wherein said magnetic material is NiFe.

* * * * *

UNITED STATES PATENT AND TRADEMARK OFFICE
CERTIFICATE OF CORRECTION

PATENT NO. : 5,922,182

DATED : July 13, 1999

INVENTOR(S) : Maass, et al.

It is certified that error appears in the above-identified patent and that said Letters Patent is hereby corrected as shown below:

On cover page, in the section titled Other Publications, change "C-846" to
- - C-84C - -.
On cover page, U.S. Patent Documents, References Cited, line 56, change "4/1986" to
- - 1/1983 - -.

Signed and Sealed this

Fourth Day of July, 2000

Attest:

Q. TODD DICKINSON

*Attesting Officer*  *Director of Patents and Trademarks*